United States Patent
Madan et al.

(10) Patent No.: US 12,026,401 B2
(45) Date of Patent: Jul. 2, 2024

(54) DRAM ROW MANAGEMENT FOR PROCESSING IN MEMORY

(71) Applicant: Advanced Micro Devices, Inc., Santa Clara, CA (US)

(72) Inventors: Niti Madan, Bee Cave, TX (US); Yasuko Eckert, Redmond, WA (US); Varun Agrawal, Westford, MA (US); John Kalamatianos, Arlington, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/855,109

(22) Filed: Jun. 30, 2022

(65) Prior Publication Data

US 2024/0004584 A1 Jan. 4, 2024

(51) Int. Cl.
*G06F 12/00* (2006.01)
*G06F 3/06* (2006.01)

(52) U.S. Cl.
CPC .......... *G06F 3/0659* (2013.01); *G06F 3/0604* (2013.01); *G06F 3/0653* (2013.01); *G06F 3/0679* (2013.01)

(58) Field of Classification Search
CPC .... G06F 3/0659; G06F 3/0604; G06F 3/0653; G06F 3/0679
See application file for complete search history.

(56) References Cited

U.S. PATENT DOCUMENTS

| | | | | |
|---|---|---|---|---|
| 2007/0249503 A1* | 10/2007 | Ariyur | ................... | H04B 1/036 340/539.22 |
| 2014/0068203 A1* | 3/2014 | Son | ......................... | G06F 3/068 711/155 |
| 2020/0073753 A1* | 3/2020 | Kim | ....................... | G06F 3/0679 |
| 2022/0019360 A1* | 1/2022 | La Fratta | .............. | G06F 3/0659 |
| 2022/0121398 A1* | 4/2022 | Nale | ...................... | G06F 3/0659 |
| 2022/0374150 A1* | 11/2022 | Capri | ................... | G06F 13/1689 |
| 2022/0374166 A1* | 11/2022 | La Fratta | .............. | G06F 3/0673 |
| 2023/0016520 A1* | 1/2023 | Sforzin | ............ | G11C 29/50008 |
| 2023/0205693 A1* | 6/2023 | Kotra | ................... | G06F 9/30043 711/122 |
| 2024/0103763 A1 | 3/2024 | Islam et al. | | |

OTHER PUBLICATIONS

Islam, Mahzabeen, et al., "U.S. Application as Filed", U.S. Appl. No. 17/953,723, filed Sep. 27, 2022, 52 pages.
U.S. Appl. No. 17/953,723, "Restriction Requirement", U.S. Appl. No. 17/953,723, Feb. 20, 2024, 6 pages.

* cited by examiner

*Primary Examiner* — John A Lane
(74) *Attorney, Agent, or Firm* — FIG. 1 Patents (57) ABSTRACT

In accordance with described techniques for DRAM row management for processing in memory, a plurality of instructions are obtained for execution by a processing in memory component embedded in a dynamic random access memory. An instruction is identified that last accesses a row of the dynamic random access memory, and a subsequent instruction is identified that first accesses an additional row of the dynamic random access memory. A first command is issued to close the row and a second command is issued to open the additional row after the row is last accessed by the instruction.

20 Claims, 5 Drawing Sheets

DRAM ROW MANAGEMENT FOR PROCESSING IN MEMORY

BACKGROUND

Processing in memory (PIM) devices can be embedded within a dynamic random access memory (DRAM) structure, e.g., in one or more DRAM chips. The PIM devices enable data to be obtained from the DRAM and processed entirely within the DRAM structure, thereby decreasing data transfer latency as compared to standard computer architectures that utilize remote processing hardware. In contrast to conventional DRAM requests (e.g., those that obtain data from DRAM for processing by a remote processing unit), PIM requests are executed in program order to preserve functional correctness.

BRIEF DESCRIPTION OF THE DRAWINGS

The detailed description is described with reference to the accompanying figures.

DETAILED DESCRIPTION

Overview

Processing in memory (PIM) components can be embedded within a dynamic random access memory (DRAM) structure, e.g., in one or more DRAM chips. The PIM components enable data to be obtained from the DRAM and processed entirely within the DRAM structure. A typical DRAM includes multiple DRAM banks that each include multiple memory arrays. In some instances, for example, the memory arrays are organized into rows and columns of a grid, such that data is maintained in individual cells of the grid.

To access data of a DRAM bank, a memory controller issues an activate command to load the DRAM row that maintains the desired data into a row buffer of the DRAM bank. In other words, the activate command "opens" the DRAM row. Data associated with a particular row and column address can be read from the open DRAM row for further processing, e.g., by a remote processing unit or by a PIM component. Additionally or alternatively, processed data can be written to a particular row and column address of the open DRAM row. Before a new DRAM row is opened, the memory controller issues a precharge command to load the data from the row buffer back to the DRAM bank. Notably, the precharge command "closes" the DRAM row. Therefore, accessing data of a new DRAM row involves closing a previously opened DRAM row via a precharge command, and opening the new DRAM row via an activate command.

Opening a DRAM row and closing a DRAM row are both relatively long latency operations. As such, memory controllers often implement DRAM row management policies to improve memory bandwidth. However, such conventional row management policies rely on assumption and/or prediction for row management, which is sub-optimal for PIM requests. This is because the PIM code execution path is established when the PIM code is initially written by a programmer, and as such, PIM instructions that last access an open DRAM row and PIM instructions that first access a new DRAM row are identifiable well before the PIM instructions are issued to the DRAM.

To solve these problems, DRAM row management for processing in memory is described. In accordance with the described techniques, a plurality of PIM instructions are analyzed to identify a PIM instruction that last accesses a first DRAM row and a subsequent PIM instruction that first accesses a second DRAM row. Since the PIM code execution path is fully established at the time that the PIM code is written, this analysis can be performed by the compiler at compile time, or by the memory controller after the PIM code is compiled. Regardless, the PIM instruction that last accesses a first DRAM row and the subsequent PIM instruction that first accesses a second DRAM row are identified prior to the plurality of PIM instructions being issued to the DRAM for execution by the PIM component(s).

The memory controller issues an auto-precharge command to close the first DRAM row after the first DRAM row is last accessed by the PIM instruction. If the PIM instruction is not the last accessor of the first DRAM row, the first DRAM row is left open. By doing so, the memory controller avoids unnecessarily closing the first DRAM row when it needs to be subsequently accessed by a later instruction. In at least one implementation, one or more independent PIM instructions that do not depend on access to a particular DRAM row for execution are executed after the PIM instruction that last accesses the first DRAM row and before the subsequent PIM instruction that first accesses the second DRAM row. Thus, by closing the first DRAM row immediately after the row access, the first DRAM row is closed in parallel with execution of the one or more independent instructions by the PIM component.

In one or more implementations, the memory controller issues an activate command to open the second DRAM row after the first DRAM row is closed by the auto-precharge command Prior to issuing the activate command, a computation time of the one or more independent instructions is calculated, e.g., by the compiler or the memory controller. If the computation time exceeds a threshold (e.g., the computation time extends beyond the latency of closing a DRAM row), then the memory controller also issues the activate command. In this way, the second DRAM row is opened in parallel with execution of the one or more independent instructions by the PIM component.

Thus, in contrast to conventional techniques, the techniques described herein only close a DRAM row once based on a known PIM code execution path with little to no error, thereby reducing instruction issue overhead. Further, the latency of closing and opening DRAM rows is overlapped with useful independent PIM computation time. Accordingly, the described techniques lead to increased computational efficiency and performance over conventional DRAM row management policies.

In some aspects, the techniques described herein relate to a method comprising: obtaining a plurality of instructions for execution by a processing in memory component embedded in a dynamic random access memory; identifying an instruction of the plurality of instructions that last accesses a row of the dynamic random access memory; and issuing a command that closes the row after the row is last accessed by the instruction.

In some aspects, the techniques described herein relate to a method, further comprising issuing an additional command that opens an additional row of the dynamic random access memory, the additional command issued after the command.

In some aspects, the techniques described herein relate to a method, wherein the command is an auto-precharge command and the additional command is an activate command.

In some aspects, the techniques described herein relate to a method, further comprising identifying a subsequent instruction of the plurality of instructions that first accesses a new row of the dynamic random access memory, wherein the new row is the additional row.

In some aspects, the techniques described herein relate to a method, wherein the plurality of instructions includes one or more independent instructions to be executed after the instruction and before the subsequent instruction, the one or more independent instructions being executable without accessing a row of the dynamic random access memory.

In some aspects, the techniques described herein relate to a method, wherein the command causes the dynamic random access memory to close the row concurrently while the processing in memory component executes the one or more independent instructions In some aspects, the techniques described herein relate to a method, wherein the additional command causes the dynamic random access memory to open the additional row concurrently while the processing in memory component executes the one or more independent instructions.

In some aspects, the techniques described herein relate to a method, further comprising issuing the additional command based on a computation time of the one or more independent instructions exceeding a threshold.

In some aspects, the techniques described herein relate to a method, wherein the instruction is identified based on metadata encoded in the instruction indicating that the row is last accessed by the instruction.

In some aspects, the techniques described herein relate to a method, wherein the instruction is identified by comparing rows of the dynamic random access memory accessed by the plurality of instructions.

In some aspects, the techniques described herein relate to a system comprising: a dynamic random access memory; a processing in memory component embedded in the dynamic random access memory; and a memory controller to: receive a plurality of instructions for execution by the processing in memory component; compare rows of the dynamic random access memory accessed by the plurality of instructions; identify an instruction that last accesses a row of the dynamic random access memory and a subsequent instruction that first accesses an additional row of the dynamic random access memory; and issue a first command that closes the row and a second command that opens the additional row after the row is last accessed by the instruction.

In some aspects, the techniques described herein relate to a system, wherein the memory controller is configured to receive the plurality of instructions in an order in which the instructions are to be executed by the processing in memory component.

In some aspects, the techniques described herein relate to a system, further comprising a host processing unit configured to identify the instruction that last accesses the row during address translation and based on a comparison of the row accessed by the instruction to one or more subsequently received instructions.

In some aspects, the techniques described herein relate to a system, wherein the memory controller is configured to compare the rows accessed by the plurality of instructions when the instructions are enqueued for dispatch to the processing in memory component.

In some aspects, the techniques described herein relate to a system, wherein the first command causes the dynamic random access memory to close the row and the second command causes the dynamic random access memory to open the additional row concurrently while the processing in memory component executes one or more independent instructions, the one or more independent instructions being executable without accessing a row of the dynamic random access memory.

In some aspects, the techniques described herein relate to a method comprising: compiling a program to generate a plurality of instructions for execution by a processing in memory component embedded in a dynamic random access memory; during the compiling, marking an instruction of the plurality of instructions with metadata indicating that the instruction last accesses a row of the dynamic random access memory; and transmitting the plurality of instructions to a memory controller, the metadata directing the memory controller to issue a command that closes the row after the row is last accessed by the instruction.

In some aspects, the techniques described herein relate to a method, further comprising, during the compiling, identifying a subsequent instruction that first accesses an additional row of the dynamic random access memory.

In some aspects, the techniques described herein relate to a method, further comprising, during the compiling, marking the instruction with additional metadata identifying the additional row accessed by the subsequent instruction.

In some aspects, the techniques described herein relate to a method, wherein the additional metadata directs the memory controller to issue an additional command that opens the additional row after the row is last accessed by the instruction.

In some aspects, the techniques described herein relate to a method, wherein the instruction is marked with the additional metadata based on a computation time associated with one or more independent instructions exceeding a threshold value, the one or more independent instructions configured to be executed after the instruction and before the subsequent instruction and being executable without accessing a row of the dynamic random access memory.

Figure 1:
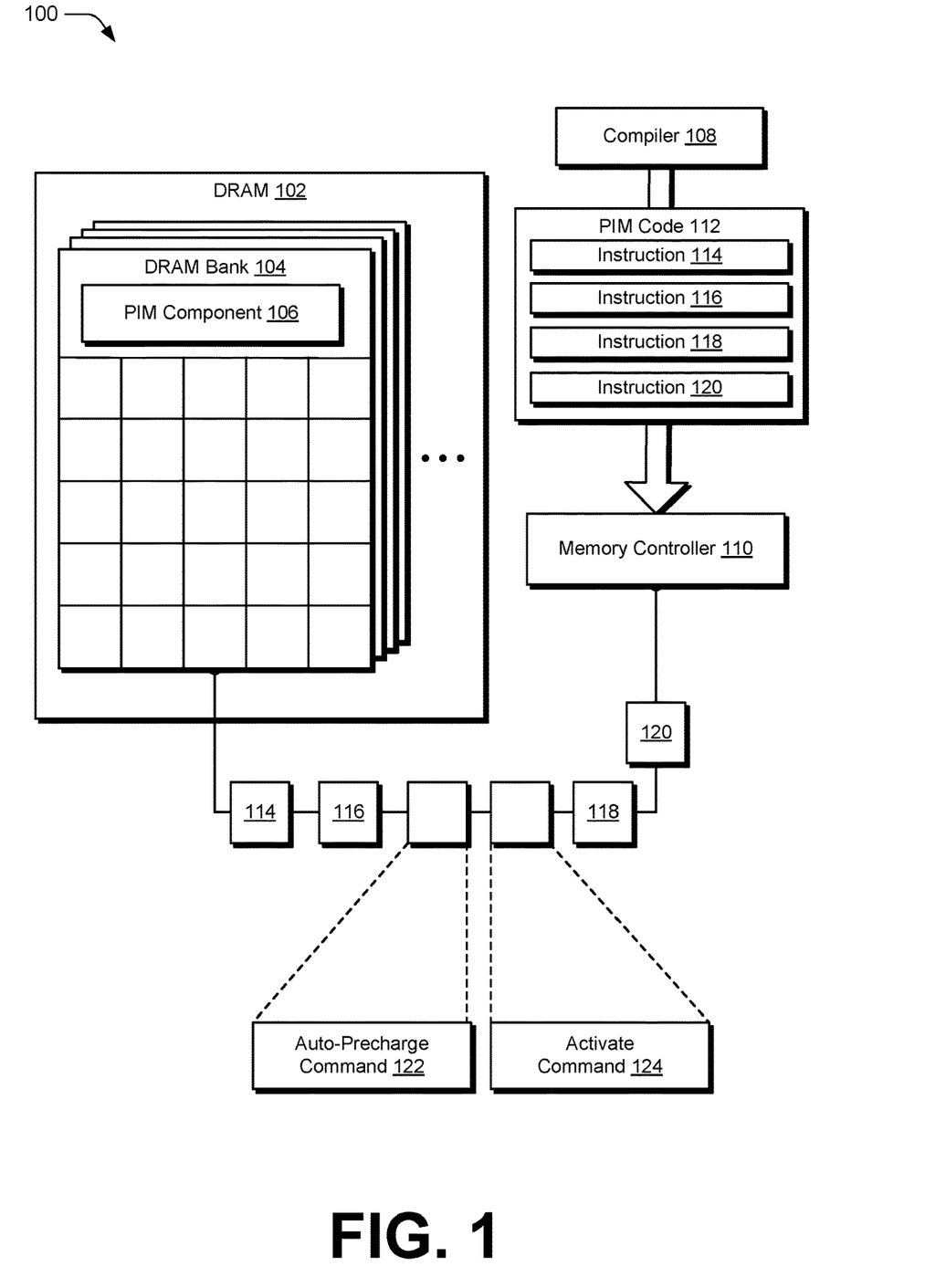
FIG. 1 is a block diagram of a non-limiting example system having a memory controller and a processing in memory component embedded in a dynamic random access memory according to some implementations.

FIG. 1 is a block diagram of a non-limiting example system 100 having a memory controller and a processing in memory component embedded in a dynamic random access memory according to some implementations. In particular, the system 100 includes a dynamic random access memory (DRAM) 102, which includes one or more DRAM banks 104 and one or more processing in memory (PIM) components 106 embedded in the DRAM 102. The system 100 also includes a compiler 108 and a memory controller 110.

Notably, the DRAM 102 can include one or more (e.g., one, two, four, eight, sixteen, etc.) DRAM chips, and can be implemented on one of a variety of different memory structures, such as a dual in-line memory module (DIMM), a three-dimensional stacked memory, or a double data rate (DDR) memory, to name just a few. Moreover, each of the DRAM chips includes a number of (e.g., eight) DRAM banks 104, which each further include a number of (e.g., four, eight, sixteen, etc.) memory arrays. Thus, while the DRAM 102 is illustrated as including a single DRAM bank 104 having a set of four memory arrays, it is to be appreciated that the DRAM 102 can include any number of DRAM chips, any number of DRAM banks 104 per chip, and any number of memory arrays per DRAM bank 104.

In one or more implementations, at least some processing capabilities of the system 100 are provided by one or more PIM components 106. Notably, the PIM components 106 are embedded in the DRAM 102 structure, enabling data to be obtained from a DRAM bank 104 and processed entirely within the DRAM 102 structure. In variations, a PIM component 106 can be embedded in each DRAM chip and shared among the DRAM banks 104 of a respective DRAM chip, a PIM component 106 can be embedded in one DRAM chip or a portion of the DRAM chips and shared among the DRAM banks 104 of multiple DRAM chips, and so on. Although depicted and described herein as embedded in DRAM 102, it is to be appreciated that the PIM component 106 can be embedded in different types of memory without departing from the spirit or scope of the described techniques. By way of example, the described techniques are implementable for systems in which the PIM components 106 are embedded in Random Access Memory (RAM) chip(s).

Processing in memory contrasts with standard computer architectures which obtain data from memory and process the data using a remote processing unit. As a result, these standard computer architectures suffer from increased data transfer latency, particularly when the volume of data transferred between the memory and the remote processing unit is large, which can also decrease overall computer performance. Thus, the PIM components 106 enable increased computer performance while reducing data transfer latency as compared to standard computer architectures that implement remote processing hardware.

As shown, the memory arrays of the DRAM bank 104 are each organized into a grid including rows and columns, such that data is stored in individual cells of the grid. Although illustrated as including five rows and five columns, it is to be appreciated that the memory arrays can be organized into any number of rows and any number of columns in accordance with the described techniques.

In order to access data maintained in the DRAM (e.g., to load data from the DRAM 102 for processing by the PIM component 106 and/or to store data processed by the PIM component 106 in the DRAM 102), a particular row of the DRAM bank 104 that maintains the desired data is opened. As used herein, "opening" a DRAM row is achieved via an activate command that causes the data maintained in the DRAM row to be loaded into a row buffer. From the row buffer, data maintained in a row and column address of the particular DRAM row can be read for further processing by the PIM component 106, and data processed by the PIM component 106 can be written to a row and column address of the particular DRAM row. In order to open a new DRAM row, a previously opened DRAM row is closed. As used herein, "closing" a DRAM row is achieved via a precharge command which causes the data that is currently maintained in the row buffer to be written back to the DRAM row in the DRAM bank 104. Therefore, accessing data of a new DRAM row involves closing a previously opened DRAM row, and opening the new DRAM row.

In accordance with the described techniques, the compiler 108 compiles a program to generate a plurality of PIM instructions 114, 116, 118, 120 for execution by the PIM component 106. The PIM code 112 can include dependent instructions, which depend on access to a particular DRAM row for execution, as well as independent instructions, which do not depend on access to a particular DRAM row. By way of example, in order to perform PIM operations on data maintained in the DRAM 102, PIM load instructions are initially executed to load the data from an open DRAM row to a PIM register file. From there, independent PIM instructions are executed causing the PIM component 106 to process data residing in the PIM register file without accessing a DRAM row. Further, PIM store instructions are executed to store the processed data residing in the PIM register file to an open DRAM row. Thus, in this example, the PIM load instructions and the PIM store instructions depend on access to a DRAM row in order to load data from, or store data to, the DRAM row, respectively. In contrast, the independent PIM instructions operate on data residing in the PIM register file, and as such, do not depend on access to a particular DRAM row.

In implementations, a host processing unit receives the instructions 114, 116, 118, 120 from the compiler 108. The host processing unit is configured to perform a variety of functions with respect to the instructions 114, 116, 118, 120, including but not limited to, address translation and DRAM row address comparison, as further discussed below with reference to FIG. 2. The memory controller 110 receives the instructions from the host processing unit and issues the instructions 114, 116, 118, 120 to the DRAM 102 for execution.

Notably, the PIM instructions 114, 116, 118, 120 are configured to operate on all DRAM banks 104 of the DRAM 102 in parallel, and as such, the PIM instructions 114, 116, 118, 120 are configured to be executed in program order. Indeed, the compiler 108 obtains the PIM instructions 114, 116, 118, 120 in execution order, the compiler 108 passes the PIM instructions 114, 116, 118, 120 in execution order to the host processing unit, the host processing unit dispatches the instructions 114, 116, 118, 120 in execution order to the memory controller 110, and the memory controller 110 issues the PIM instructions 114, 116, 118, 120 to the DRAM 102 in execution order. Thus, in contrast to standard computer architectures that execute instructions based on a dynamically determined schedule, the PIM code 112 execution path is established at a time when the PIM code is initially generated.

In one or more implementations, the system 100 includes a remote processing unit. In these implementations, the memory controller 110 schedules conventional DRAM traffic (e.g., instructions that obtain data from DRAM 102 for processing by the remote processing unit) alongside the PIM instructions 114, 116, 118, 120. In doing so, the memory controller 110 schedules the PIM code 112 in groups of PIM instructions 114, 116, 118, 120, rather than interleaving the PIM code with the conventional DRAM instructions. As such, the PIM code 112 is issued to the DRAM 102 in a stream of PIM instructions 114, 116, 118, 120, one after another.

As mentioned above, accessing data of a new DRAM row of the DRAM bank 104 involves closing a previously opened DRAM row and opening the new DRAM row.

However, closing a DRAM row and opening a DRAM row are both relatively long latency operations. In order to improve memory bandwidth, conventional memory controllers implement DRAM row management policies. In a closed row policy, a conventional memory controller issues an auto-precharge command after each DRAM row access to automatically close the DRAM row. While the closed row policy can benefit workflows with low row buffer locality and irregular row accesses, a DRAM row is unnecessarily closed and re-opened if it is subsequently accessed. In an open row policy, a conventional memory controller does not issue an auto-precharge command after a DRAM row is accessed, thereby leaving the DRAM row open. While the open row policy can benefit certain workloads that have high row buffer locality, each access to a new DRAM row requires both closing the previously opened DRAM row and opening the new DRAM row.

Some conventional memory controllers implement a more complex hybrid row management policy where the open row policy or the closed row policy is dynamically chosen depending on workload behavior. For example, the hybrid row management policy uses a prediction mechanism to implement either the open row policy or the closed row policy based on bank idle time, row access patterns, and the like. While this hybrid page management policy works for conventional, dynamically scheduled DRAM instructions (e.g., instructions that obtain data from DRAM for processing by a remote processing unit), it is sub-optimal for PIM instructions. This is due to the highly deterministic nature of the PIM code 112 execution, which makes the prediction utilized by the conventional hybrid row management policy unnecessary. Indeed, since the PIM code 112 execution path is established when the program is initially written, PIM instructions that last access a DRAM row and PIM instructions that first access a new DRAM row are identifiable well before the PIM instructions 114, 116, 118, 120 are issued to the DRAM 102.

An "early page activate" feature is also supported by some conventional memory controllers, in which a memory controller relies on hints sent from the main data fabric (e.g., of a remote processing unit) to prepare to open a row for an instruction that has not yet been enqueued for dispatch by the memory controller. However, this feature is not compatible for PIM instructions, which are often buffered at the memory controller for a period of time before they are prioritized to execute over conventional DRAM instructions.

To overcome the drawbacks of such conventional memory controllers, DRAM row management is described for processing in memory. In accordance with the described techniques and based on the known PIM code 112 execution path, in one or more implementations, the memory controller 110 issues an auto-precharge command 122 to close a DRAM row immediately after the DRAM row is last accessed. In at least one variation, the memory controller 110 is further configured to issue an activate command 124 to proactively open the next DRAM row accessed in the PIM code 112.

To do so, the memory controller 110 initially obtains the instructions 114, 116, 118, 120 from the compiler 108. In accordance with the illustrated example, the instructions are configured to be executed from first to last in the following order: (1) instruction 114, (2) instruction 116, (3) instruction 118, and (4) instruction 120. Accordingly, the compiler 108 receives the instructions 114, 116, 118, 120 in the above-noted order and passes the instructions 114, 116, 118, 120 to the memory controller 110 in the above-noted order. In the illustrated example, instructions 114 and 116 access a first DRAM row, instruction 118 is an independent instruction, and instruction 120 accesses a second DRAM row.

In implementations, the memory controller 110 identifies an instruction of the instructions 114, 116, 118, 120 that last accesses a DRAM row. Thus, in the illustrated example, the memory controller 110 identifies instruction 116 as the PIM instruction that last accesses the first DRAM row. Since the instructions 114, 116, 118, 120 are received and enqueued for dispatch by the memory controller 110 in execution order, the memory controller 110 can compare DRAM rows accessed by the instructions 114, 116, 118, 120 to identify the instruction 116 that last accesses the first DRAM row, as further discussed below with reference to FIG. 2. Additionally or alternatively, since the PIM code 112 execution path is established when initially generated, the memory controller 110 can identify the instruction 116 that last accesses the first DRAM row based on the instruction 116 being marked with software hints by the compiler 108 and/or a programmer, as further discussed below with reference to FIG. 3.

As shown, the memory controller 110 issues the auto-precharge command 122 to close the first DRAM row after the first DRAM row is last accessed by the instruction 116. In accordance with the described techniques, the auto-precharge command 122 is issued immediately after the instruction 116 that last accesses the first DRAM row, e.g., prior to an additional PIM instruction being issued. By doing so, the DRAM 102 can begin closing the first DRAM row concurrently while the PIM component 106 executes one or more subsequent, independent instructions, e.g., instruction 118. In this way, the system 100 overlaps DRAM precharge time with PIM computation time for executing the independent instruction 118, rather than waiting to execute the independent instruction 118 until after the first row is closed. This increases computational efficiency for the system 100 because the latency for closing the first DRAM row is at least partially hidden by useful PIM computation time for executing the independent instruction(s) 118.

In contrast to a conventional closed row policy, the techniques described herein only issue an auto-precharge command when a DRAM row is last accessed, thus eliminating unnecessary row closures. Further, in contrast to a conventional open row policy, the techniques described herein automatically close an open DRAM row after it is last accessed, rather than waiting until a new DRAM row is subsequently accessed. Moreover, in contrast to a conventional hybrid row management policy, the system 100 issues the auto-precharge command 122 based on a known PIM code 112 execution path, rather than issuing the command based on a prediction. As such, the described techniques greatly reduce the possibility of predicting that the auto-precharge command 122 is to be issued following an instruction that is not the last accessor of a DRAM row. Therefore, in contrast to conventional techniques, the memory controller 110 issues an auto-precharge command 122 directly after a DRAM row is last accessed with little to no chance of performance degradation due to unnecessarily closing the row.

In addition to identifying an instruction that last accesses a DRAM row, the memory controller 110 is configured to identify a subsequent instruction that first accesses a new DRAM row. Thus, in the illustrated example, the memory controller 110 identifies the instruction 116 that last accesses the first DRAM row and the instruction 120 that first accesses the second DRAM row. As further discussed below with regard to FIGS. 2 and 3, this identification can be based on one or both of the instructions 116, 120 being marked with software hints by the compiler 108 and/or the programmer, or a comparison, by the memory controller 110, of DRAM rows accessed by the instructions 114, 116, 118, 120.

As shown, the memory controller 110 also issues the activate command 124 to open the second DRAM row after the first DRAM row is closed by the auto-precharge command 122. In some implementations, the activate command 124 is issued based on a computation time associated with one or more independent instructions that are to be executed after the instruction that last accesses a DRAM row, and prior to the subsequent instruction that first accesses a new DRAM row. Thus, in the illustrated example, a computation time is calculated (e.g., by the compiler 108 or the memory controller 110) for the PIM component 106 to execute the independent PIM instruction(s) 118. If the computation time exceeds a threshold, then the activate command 124 is issued. The threshold, for example, can be a latency associated with closing a DRAM row. In this example, the activate command 124 is issued if the computation time of the independent instruction 118 exceeds the time it takes to close a DRAM row. If the computation time of the independent instruction 118 does not exceed the threshold, then the activate command is not issued.

The activate command 124 is issued immediately after the auto-precharge command 122, e.g., prior to an additional PIM instruction being issued. By doing so, the DRAM 102 can begin opening the second DRAM row concurrently while the PIM component 106 executes one or more subsequent, independent instructions, e.g., instruction 118. Since the activate command 124 is issued based on the computation time of the independent instruction 118 extending beyond the latency of closing the first DRAM row, the system 100 can overlap the DRAM activate time with PIM computation time for executing the independent instruction 118. This contrasts with the conventional open row policy, which waits to open a new DRAM row until the DRAM row is ultimately accessed. The described techniques, therefore, increase computational efficiency for the system 100 because the latency for opening the second DRAM row is at least partially hidden by useful PIM computation time for executing the independent instruction(s) 118.

In contrast to a conventional early page activate feature implemented by conventional memory controllers, the memory controller 110 issues an activate command 124 while the memory controller 110 is actively issuing a stream of PIM instructions 114, 116, 118, 120. Indeed, the activate command 124 is issued immediately after a PIM instruction that last accesses a DRAM row and before one or more independent PIM instructions as well as a PIM instruction that first accesses a new DRAM row. Thus, the described techniques avoid the error of opening a new DRAM row unnecessarily while the PIM instruction that first accesses the new DRAM row is buffered at the memory controller 110.

Figure 2:
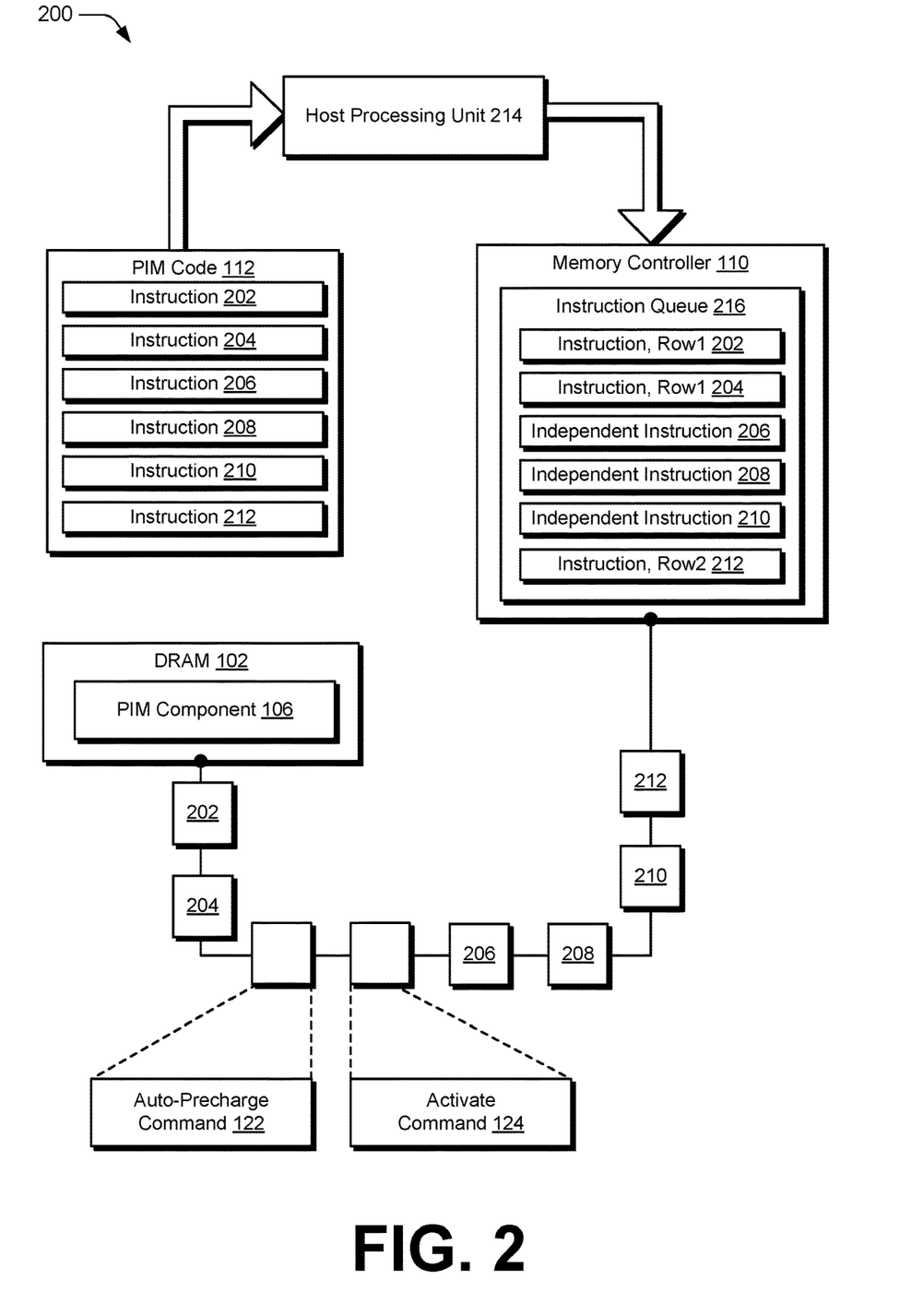
FIG. 2 depicts a non-limiting example in which a memory controller issues an auto-precharge command and an activate command by comparing rows of a dynamic random access memory accessed by a plurality of processing in memory instructions.

FIG. 2 depicts a non-limiting example 200 in which a memory controller issues an auto-precharge command and an activate command by comparing rows of a dynamic random access memory accessed by a plurality of processing in memory instructions. Example 200 includes from FIG. 1, the DRAM 102, the PIM component 106, the memory controller 110, and the PIM code 112. Notably, the PIM code 112, including a plurality of PIM instructions 202, 204, 206, 208, 210, 212, is received by a host processing unit 214 configured to identify physical memory addresses of the plurality of PIM instructions 202, 204, 206, 208, 210, 212. The memory controller 110, in the illustrated example 200, receives and enqueues the instructions 202, 204, 206, 208, 210, 212, in an instruction queue 216. From the instruction queue 216, the instructions 202, 204, 206, 208, 210, 212 are dispatched, in order, to the DRAM 102 for execution by the PIM component 106.

In accordance with the described techniques, the host processing unit 214 receives the PIM instructions 202, 204, 206, 208, 210, 212 in execution order, e.g., an order in which the PIM instructions are to be executed by the PIM component 106. In the illustrated example, the instructions are to be executed in the following order from first to last: (1) instruction 202, (2) instruction 204, (3) instruction 206, (4) instruction 208, (5) instruction 210, (6) instruction 212. Therefore, the host processing unit 214 receives the instructions 202, 204, 206, 208, 210, 212 in the above-noted order, i.e., the host processing unit 214 first receives the instruction 202 that is to be executed first, followed by the instruction 204 that is to be executed second, and so forth. Further, the memory controller 110 receives and dispatches the instructions 202, 204, 206, 208, 210, 212 in the above-noted order.

In implementations, the host processing unit 214 is configured to perform an address translation process on the instructions as the instructions 202, 204, 206, 208, 210, 212 are received from the compiler 108. For instance, the host processing unit 214 performs address translation to identify physical memory addresses (e.g., specific row and column addresses of the DRAM 102) associated with the instructions 202, 204, 206, 208, 210, 212. The memory controller 110 utilizes the physical memory addresses as determined by the host processing unit 214 to open and close the correct DRAM rows.

By way of example, the host processing unit 214 receives and processes the instruction 202 to determine that that the instruction 202 accesses a first row of the DRAM 102. Next, the host processing unit 214 receives and processes the instruction 204 to determine that the instruction 204 also accesses the first row of the DRAM 102. Further, the host processing unit 214 receives and processes the instructions 206, 208, 210 to determine that the instructions 206, 208, 210 are independent instructions that operate on data residing in the PIM register file. Lastly, the host processing unit 214 receives and processes the instruction 212 to determine that the instruction 212 accesses a second row of the DRAM 102. Upon receiving the instructions, the memory controller 110 enqueues the instructions 202, 204, 206, 208, 210, 212 with respective physical row addresses in the instruction queue 216 for dispatch to the DRAM 102.

In one or more implementations, the host processing unit 214 is configured to compare rows of the DRAM 102 accessed by the plurality of instructions 202, 204, 206, 208, 210, 212 to identify an instruction 204 that last accesses a first DRAM row and a subsequent instruction 212 that first accesses a second DRAM row. In some implementations, the host processing unit 214 compares the rows accessed by the instructions 202, 204, 206, 208, 210, 212 as they are received during address translation. To do so, the host processing unit 214 compares the physical row address of the particular instruction being processed to an earlier arriving instruction. Thus, the host processing unit 214 identifies the instruction 204 that last accesses the first DRAM row and the instruction 212 that first accesses the second DRAM row upon encountering the instruction 212 during address translation. In variations, row address comparison can also be performed during address translation by a coherent slave.

Additionally or alternatively, the host processing unit 214 identifies the instruction 204 as the last accessor of the first DRAM row before performing address translation on the instruction 212 based on subsequent independent PIM computation time. For example, the host processing unit 214 calculates the PIM computation time associated with the independent instructions 206, 208, 210 that immediately follow the instruction 204. If the independent PIM computation time exceeds a threshold value, then the memory controller 110 identifies the instruction 204 as the last accessor of the first DRAM row prior to encountering a subsequent instruction 212 that first accesses a second DRAM row.

Regardless, the host processing unit 214 is configured to mark the instruction 204 with metadata identifying the instruction 204 as the last accessor of the first DRAM row. In some implementations, the host processing unit 214 marks the instruction 212 with metadata identifying the instruction 212 as the first accessor of the second DRAM row. In this way, the memory controller 110 identifies the instruction 204 that last accesses the first DRAM row and the instruction 212 that first accesses a second DRAM row based on the instructions 204, 212 being marked with the metadata.

Additionally or alternatively, the memory controller 110 identifies the instruction 204 that last accesses the first DRAM row and the instruction 212 that first accesses the second DRAM row without the instructions 204, 212 being marked with metadata. By way of example, the memory controller 110 compares the rows accessed by the instructions when the instructions 202, 204, 206, 208, 210, 212 are enqueued in the instruction queue 216 for dispatch to the PIM component 106. Since the physical row addresses of the instructions 202, 204, 206, 208, 210, 212 are determined by the host processing unit 214 during address translation, the memory controller 110 can compare the physical row addresses of earlier-enqueued instructions to later-enqueued instructions to identify the instruction 204 that last accesses a first DRAM row and the instruction 212 that first accesses a second DRAM row.

As shown, the memory controller 110 is configured to issue an auto-precharge command 122 to close the first DRAM row after the first DRAM row is last accessed by the instruction 204. In one variation, the memory controller 110 is instructed to issue the auto-precharge command 122 based on the instruction 204 being marked with the metadata by the host processing unit 214. In another variation, the memory controller 110 issues the auto-precharge command 122 based on an identification of the instruction 204 by the memory controller 110 from the instruction queue 216. In one or more implementations, the memory controller 110 also issues an activate command 124 to open the second DRAM row after the first DRAM row is closed by the auto-precharge command 122. As discussed above, the activate command 124 is issued based on a computation time associated with the independent instructions 206, 208, 210.

For example, the memory controller 110 calculates a computation time associated with the independent instructions 206, 208, 210 while the instructions 202, 204, 206, 208, 210, 212 are enqueued for dispatch. If the time it takes to process the independent instructions 206, 208, 210 exceeds a threshold time (e.g., the time it takes to close a DRAM row, or the time it takes to both close a DRAM row and open a new DRAM row), then the memory controller 110 issues the activate command 124. In one variation, the memory controller 110 is instructed to issue the activate command 122 based on the instruction 212 being marked with the metadata by the host processing unit 214. In another variation, the memory controller 110 issues the activate command 122 based on an identification of the instruction 212 by the memory controller 110 from the instruction queue 216. If the time it takes to process the independent instructions 206, 208, 210 does not exceed the threshold time, then the memory controller 110 does not issue the activate command 124.

Figure 3:
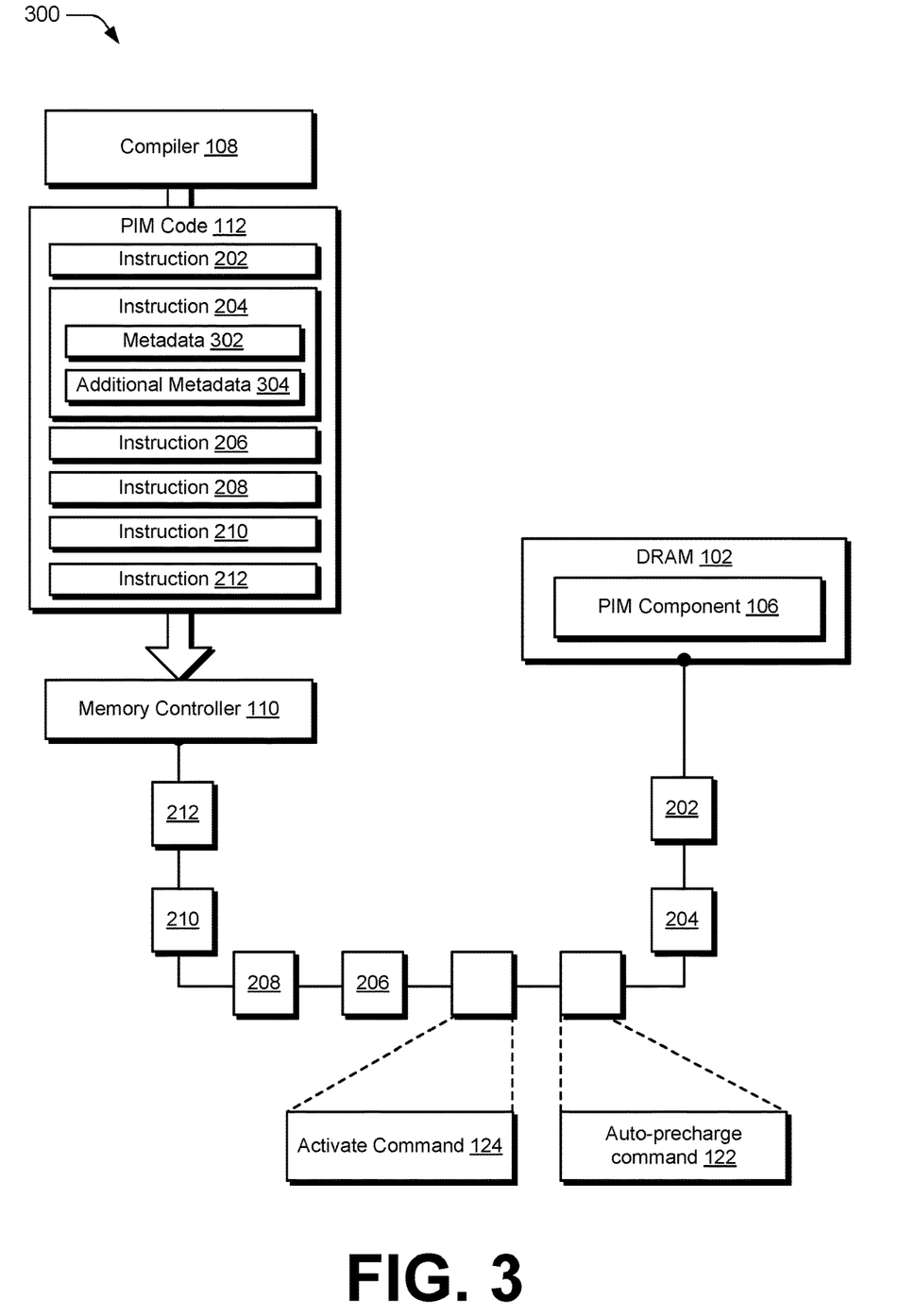
FIG. 3 depicts a non-limiting example in which a memory controller issues an auto-precharge command and an activate command based on metadata encoded in a processing in memory instruction.

FIG. 3 depicts a non-limiting example 300 in which a memory controller issues an auto-precharge command and an activate command based on metadata encoded in a processing in memory instruction. Example 300 includes from FIG. 1, the DRAM 102, the PIM component 106, the memory controller 110, and the PIM code 112. Further, example 300 includes from FIG. 2 the PIM instructions 202, 204, 206, 208, 210, 212. The compiler 108, in the illustrated example 300, marks the instruction 204 that last accesses the first row of the DRAM 102 with metadata 302 directing the memory controller 110 to issue the auto-precharge command 122, and additional metadata 304 directing the memory controller 110 to issue the activate command 124.

In accordance with the described techniques, the compiler 108 compiles a program to generate a plurality of instructions 202, 204, 206, 208, 210, 212 for execution by the PIM component 106. Notably, the compiler 108 receives the program, including the PIM code 112, as generated by a programmer Since the PIM code 112 operates on all DRAM banks in parallel, the PIM code 112 is generated by the programmer and received by the compiler 108 in an order in which the instructions 202, 204, 206, 208, 210, 212 are to be executed. Accordingly, the PIM code 112 execution path is known when the program is written by the programmer, and by the compiler 108 at compile time.

At compile time, the compiler 108 marks the instruction 204 with metadata 302 indicating that the instruction 204 last accesses the first DRAM row. By way of example, the compiler 108 adds one or more bits of metadata 302 to the instruction 204 indicating to the memory controller 110 that the instruction 204 is the last accessor of the first DRAM row. Due to the deterministic nature of the PIM code 112, the compiler 108 is capable of accurately estimating page offsets of memory accesses at compile time. By doing so, the compiler 108 can accurately estimate DRAM rows that are accessed, and when different DRAM rows are accessed by the instructions 202, 204, 206, 208, 210. Therefore, the compiler 108, in some implementations, compares page offsets of estimated virtual memory addresses of the instructions 202, 204, 206, 208, 210, 212 to identify the instruction 204 that last accesses the first DRAM row. Based on the identification, the compiler 108 marks the instruction 204 with the metadata 302.

Additionally or alternatively, the compiler 108 compares page offsets of the estimated virtual memory addresses of the instructions 202, 204, 206, 208, 210, 212 to identify a subsequent instruction 212 that first accesses a second row of the DRAM 102. Further, the compiler 108 calculates a computation time associated with one or more independent instructions 206, 208, 210 that are to be executed after the instruction 204 that last accesses the first DRAM row and before the instruction 212 that first accesses the second DRAM row. If the computation time associated with the independent instructions 206, 208, 210 exceeds a threshold time (e.g., the time it takes to close a DRAM row, and/or the time it takes to close a DRAM row and open a new DRAM row), then the compiler 108 marks the instruction 204 with the additional metadata 304 that identifies the next DRAM row that will be opened.

By way of example, the compiler 108 adds one or more bits of additional metadata 304 to the instruction 204 indicating to the memory controller 110 that the second DRAM row is the next DRAM row that will be opened. Therefore, the instruction 204 that last accesses the first DRAM row is marked with metadata 302 that indicates that the instruction 204 is the last accessor of the first DRAM row and additional metadata 304 that indicates the second DRAM row is the next DRAM row to be opened. If there are no independent instructions and/or the computation time of the independent instructions 206, 208, 210 does not exceed the threshold time, then the compiler 108 does not mark the instruction 204 with the additional metadata 304.

Since the PIM code 112 is initially generated in execution order, in one or more implementations, the compiler 108 is configured to mark the instruction 204 with the metadata 302 and the additional metadata 304 based on the instruction 204 and/or the instruction 212 being marked with software hints by the programmer. For example, the compiler 108 receives the instruction 204 marked with a software hint identifying the instruction 204 as the last accessor of the first DRAM row. Based on this software hint, the compiler 108 encodes the instruction 204 with the metadata 302. Further, the compiler 108 receives the instruction 212 marked with a software hint identifying the instruction 212 as the first accessor of the second DRAM row. Based on the software hints, the compiler 108 determines whether the computation time of the one or more independent instructions 206, 208, 210 exceeds the threshold, and if so, the compiler 108 encodes the instruction 204 with the additional metadata 304.

Regardless, the compiler 108 transmits the PIM code 112, including the instruction 204 encoded with the metadata 302 and/or the additional metadata 304, to the memory controller 110. The metadata 302 identifying the instruction 204 as the last accessor of the first DRAM row directs the memory controller 110 to issue the auto-precharge command 122 that closes the first DRAM row after the row is last accessed by the instruction 204. The additional metadata 304 identifying the second DRAM row as the next DRAM row to be opened directs the memory controller 110 to issue the activate command 124 to open the second DRAM row after the first DRAM row is closed by the auto-precharge command 122.

Regardless of how the auto-precharge command 122 and the activate command 124 are issued (e.g., based on a comparison, by the memory controller 110 and/or the host processing unit 214, of physical DRAM rows accessed by the PIM instructions, as discussed with reference to FIG. 2, or based on PIM instructions being marked with metadata and software hints by the compiler 108 and/or the programmer and subsequently transmitted to the memory controller 110, as discussed with reference to FIG. 3), the described techniques enable certain features that improve efficiency over conventional techniques. Indeed, the auto-precharge command 122 closes the first DRAM row immediately after the last row access of the first DRAM row, rather than when the second DRAM row is subsequently accessed. By doing so, the DRAM 102 can begin closing the first DRAM row concurrently while the PIM component 106 executes the independent PIM instructions 206, 208, 210. Moreover, the activate command 124 opens the second DRAM row proactively after the first DRAM row is closed, rather than when the second DRAM row is ultimately accessed. By doing so, the DRAM 102 begins opening the second DRAM row concurrently while the PIM component 106 executes the independent instructions 206, 208, 210.

Further, the first DRAM row is closed once despite being accessed by multiple instructions 202, 204. Thus, even when there is no independent PIM computation time (i.e., there are no independent instructions to be executed in between the instruction 204 that last accesses the first DRAM row and the instruction 212 that first accesses the second DRAM row), the memory controller 110 avoids unnecessarily closing the first DRAM row before the instruction 204 is issued. Therefore, the memory controller 110 avoids additional performance overhead due to extra auto-precharge commands issued, thereby improving performance of the system 100.

Figure 4:
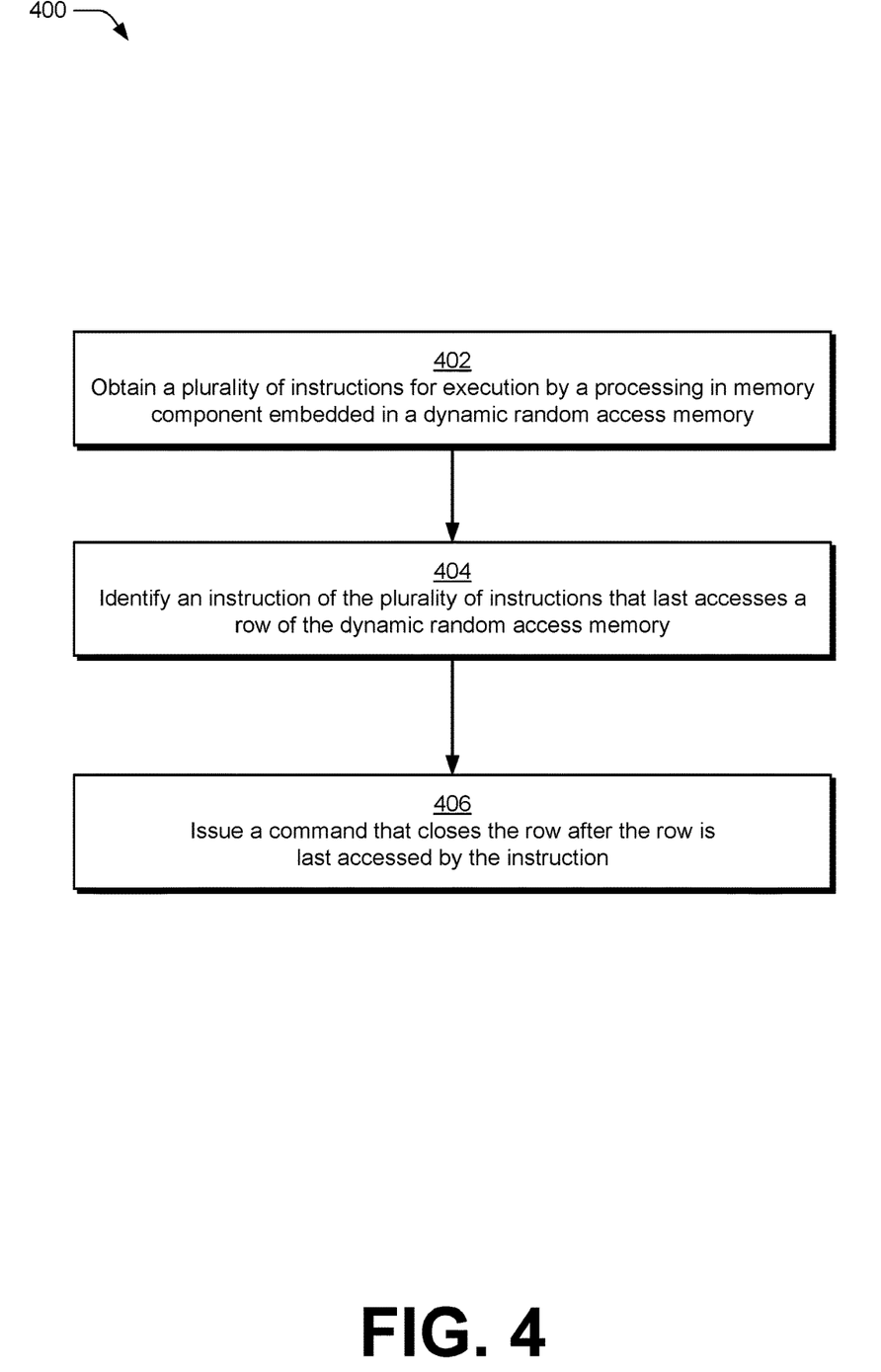
FIG. 4 depicts a procedure in an example implementation of issuing a command that closes a DRAM row after the DRAM row is last accessed.

FIG. 4 depicts a procedure 400 in an example implementation of issuing a command that closes a DRAM row after the DRAM row is last accessed. In the procedure 400, a plurality of instructions are obtained for execution by a processing in memory component embedded in a dynamic random access memory (block 402). By way of example, the memory controller 110 receives from the compiler 108, the PIM code 112 including a plurality of PIM instructions to be executed by the PIM component 106.

An instruction of the plurality of instructions is identified that last accesses a row the dynamic random access memory (block 404). By way of example, the memory controller 110 identifies a PIM instruction 204 that last accesses a row of the DRAM 102. To do so, the rows of the DRAM 102 accessed by the plurality of instructions are compared. In some variations, this comparison is performed by the host processing unit 214 during address translation as the PIM instructions are received from the compiler 108 in execution order. In other variations, this comparison is performed by the memory controller 110 when the PIM instructions are enqueued in the instruction queue 216 for dispatch to the DRAM 102 in execution order. Since the execution order of the PIM code 112 is established when a program is initially written, the compiler 108 can also identify and mark the instruction 204 with metadata 302 indicating that the DRAM row is last accessed by the PIM instruction 204. The memory controller 110 can thus identify the PIM instruction 204 that last accesses a row of the DRAM 102 based on metadata being encoded in the instruction 204 by the compiler 108.

A command is issued that closes the row after the row is last accessed by the instruction (block 406). For example, the memory controller 110 issues an auto-precharge command 122 that closes the DRAM row after the DRAM row is last accessed by the PIM instruction 204.

Figure 5:
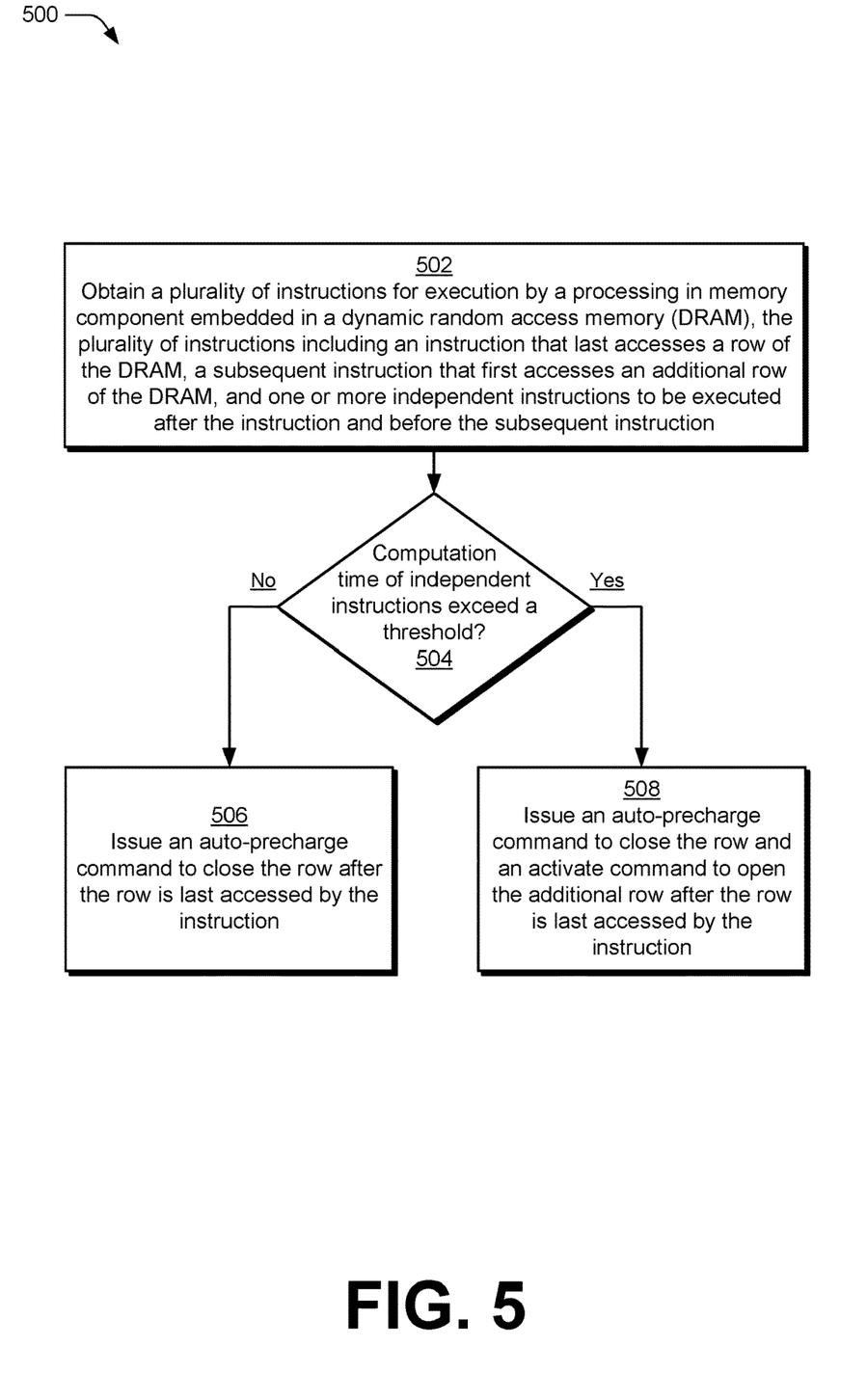
FIG. 5 depicts a procedure in an example implementation of issuing an activate command based on whether a computation time of one or more independent processing in memory instructions exceeds a threshold.

FIG. 5 depicts a procedure 500 in an example implementation of issuing an activate command based on whether a computation time of one or more independent processing in memory instructions exceeds a threshold. In procedure 500, a plurality of instructions are obtained for execution by a processing in memory component embedded in a dynamic random access memory (DRAM), the plurality of instructions including an instruction that last accesses a row of the DRAM, a subsequent instruction that first accesses an additional row of the DRAM, and one or more independent instructions to be executed after the instruction and before the subsequent instruction (block 502). For example, the memory controller 110 receives the PIM instructions 202, 204, 206, 208, 210, 212, including an instruction 204 that last accesses a first DRAM row, a subsequent instruction 212 that first accesses a second DRAM row, and independent instructions 206, 208, 210 that are to be executed after the instruction 204 and before the instruction 212. Notably, the independent instructions 206, 208, 210 are executable without accessing a row of the DRAM 102.

It is determined whether a computation time of the independent instructions exceeds a threshold (block 504). For example, the memory controller 110 determines whether the computation time of the independent instructions 206, 208, 210 exceeds a latency associated with closing a DRAM row. Additionally or alternatively, the compiler 108 determines whether the computation time of the independent instructions 206, 208, 210 exceeds the threshold.

In response to determining that the computation time of the independent instructions does not exceed the threshold (i.e., "No" at block 504), an auto-precharge command is issued to close the row after the row is last accessed by the instruction (block 506). By way of example, the memory controller 110 is configured to issue the auto-precharge command 122 and not the activate command 124 in response to determining that the computation time of the independent instructions 206, 208, 210 does not exceed the threshold. However, since there is at least some independent PIM computation time, the auto-precharge command 122 causes the DRAM 102 to close the first DRAM row concurrently while the PIM component 106 executes the independent instructions 206, 208, 210.

In response to determining that the computation time of the independent instructions does exceed the threshold (i.e., "Yes" at block 504), an auto-precharge command is issued to close the row and an activate command is issued to open the additional row after the row is last accessed by the instruction (block 508). By way of example, the memory controller 110 is configured to issue the auto-precharge command 122 and the activate command 124 in response to determining that the computation time of the independent instructions 206, 208, 210 exceeds the threshold. The auto-precharge command 122 closes the first DRAM row after the first DRAM row is last accessed by the instruction 204, and the activate command 124 opens the second DRAM row after the first DRAM row is closed by the auto-precharge command 122. Since the PIM computation time exceeds at least the latency associated with closing the first DRAM row, the auto-precharge command 122 and the activate command 124 causes the DRAM 102 to close the first DRAM row and open the second DRAM row concurrently while the PIM component executes the independent instructions 206, 208, 210.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the DRAM 102, the DRAM Bank(s) 104, the PIM component 106, the compiler 108, the memory controller 110, and the host processing unit) are implemented in any of a variety of different manners such as hardware circuitry, software or firmware executing on a programmable processor, or any combination of two or more of hardware, software, and firmware. The methods provided are implemented in any of a variety of devices, such as a general-purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general-purpose computer or a processor. Examples of non-transitory computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

CONCLUSION

Although the systems and techniques have been described in language specific to structural features and/or methodological acts, it is to be understood that the systems and techniques defined in the appended claims are not necessarily limited to the specific features or acts described. Rather, the specific features and acts are disclosed as example forms of implementing the claimed subject matter.

What is claimed is:

1. A method comprising:
   receiving a plurality of instructions for execution by a processing in memory circuit of a memory;
   identifying an instruction of the plurality of instructions that last accesses a row of the memory by comparing rows of the memory accessed by the plurality of instructions; and
   issuing a command that closes the row after the row is last accessed by the instruction.

2. The method of claim 1, further comprising issuing an additional command that opens an additional row of the memory, the additional command issued after the command.

3. The method of claim 2, wherein the command is an auto-precharge command and the additional command is an activate command.

4. The method of claim 2, further comprising identifying a subsequent instruction of the plurality of instructions that first accesses a new row of the memory, wherein the new row is the additional row.

5. The method of claim 4, wherein the plurality of instructions includes one or more independent instructions to be executed after the instruction and before the subsequent instruction, the one or more independent instructions being executable without accessing a row of the memory.

6. The method of claim 5, wherein the command causes the memory to close the row concurrently while the processing in memory circuit executes the one or more independent instructions.

7. The method of claim 5, wherein the additional command causes the memory to open the additional row concurrently while the processing in memory circuit executes the one or more independent instructions.

8. The method of claim 5, further comprising issuing the additional command based on a computation time of the one or more independent instructions exceeding a threshold.

9. The method of claim 8, wherein the threshold is based on to a latency of performing a row closure operation in the memory.

10. The method of claim 8, wherein the threshold is based on to a latency of performing a row closure operation and a row open operation in the memory.

11. The method of claim 1, wherein comparing the rows includes comparing the row accessed by the instruction to one or more subsequently received instructions during address translation.

12. A system comprising:
a memory that includes a processing in memory circuit; and
a memory controller to:
  receive a plurality of instructions for execution by the processing in memory circuit;
  compare rows of the memory accessed by the plurality of instructions;
  identify an instruction that last accesses a row of the memory and a subsequent instruction that first accesses an additional row of the memory; and
  issue a first command that closes the row and a second command that opens the additional row after the row is last accessed by the instruction.

13. The system of claim 12, wherein the memory controller is configured to receive the plurality of instructions in an order in which the plurality of instructions are to be executed by the processing in memory circuit.

14. The system of claim 12, wherein the memory controller is configured to compare the rows accessed by the plurality of instructions when the plurality of instructions are enqueued for dispatch to the processing in memory circuit.

15. The system of claim 12, wherein the first command causes the memory to close the row and the second command causes the memory to open the additional row concurrently while the processing in memory circuit executes one or more independent instructions, the one or more independent instructions being executable without accessing a row of the memory.

16. A method comprising:
compiling a program to generate a plurality of instructions for execution by a processing in memory circuit of a memory;
during the compiling, marking an instruction of the plurality of instructions with metadata indicating that the instruction last accesses a row of the memory; and
transmitting the plurality of instructions to a memory controller, the metadata directing the memory controller to issue a command that closes the row after the row is last accessed by the instruction.

17. The method of claim 16, further comprising, during the compiling, identifying a subsequent instruction that first accesses an additional row of the memory.

18. The method of claim 17, further comprising, during the compiling, marking the instruction with additional metadata identifying the additional row accessed by the subsequent instruction.

19. The method of claim 18, wherein the additional metadata directs the memory controller to issue an additional command that opens the additional row after the row is last accessed by the instruction.

20. The method of claim 18, wherein the instruction is marked with the additional metadata based on a computation time associated with one or more independent instructions exceeding a threshold value, the one or more independent instructions configured to be executed after the instruction and before the subsequent instruction and being executable without accessing a row of the memory.

* * * * *